United States Patent
Chin et al.

(10) Patent No.: US 9,459,595 B2
(45) Date of Patent: Oct. 4, 2016

(54) SYSTEM AND METHOD FOR COUPLING AN AUTOMATION CONTROLLER AND SCALEABLE MODULE

(71) Applicant: ROCKWELL AUTOMATION ASIA PACIFIC BUSINESS CENTER PTE. LTD., Singapore (SG)

(72) Inventors: Karen Chin, Singapore (SG); Rajesh Ramesh Shah, Singapore (SG); Gurdev Singh, Singapore (SG)

(73) Assignee: Rockwell Automation Asia Pacific Business Center Pte. Ltd., Singapore (SG)

( * ) Notice: Subject to any disclaimer, the term of this patent is extended or adjusted under 35 U.S.C. 154(b) by 444 days.

(21) Appl. No.: 13/738,665

(22) Filed: Jan. 10, 2013

(65) Prior Publication Data

US 2013/0184840 A1    Jul. 18, 2013

(51) Int. Cl.
*G05B 11/01* (2006.01)
*H05K 7/14* (2006.01)

(52) U.S. Cl.
CPC .............. *G05B 11/01* (2013.01); *H05K 7/1465* (2013.01); *H05K 7/1492* (2013.01); *G05B 2219/15078* (2013.01); *G05B 2219/25085* (2013.01); *G05B 2219/25314* (2013.01)

(58) Field of Classification Search
CPC ............. H05K 7/1465; H05K 7/1492; H05K 7/20536; G05B 2219/25314; G05B 2219/25085; G05B 2219/15078; G11B 33/127

USPC .......... 361/679.01, 728, 731, 736, 752, 784, 361/785, 788; 700/11, 17, 19, 83; 710/1, 2, 710/15, 18, 19, 300, 301; 439/712, 715, 439/716

See application file for complete search history.

(56) References Cited

U.S. PATENT DOCUMENTS

| | | |
|---|---|---|
| 4,738,632 A | 4/1988 | Schmidt et al. |
| 4,991,056 A | 2/1991 | Shimizu et al. |
| 5,541,810 A | 7/1996 | Donhauser et al. |
| 5,802,389 A | 9/1998 | McNutt |
| 6,046,913 A * | 4/2000 | Helmstetter ......... H05K 7/1425 361/724 |
| 6,206,327 B1 * | 3/2001 | Benedetti et al. ......... 244/159.4 |
| 6,217,391 B1 * | 4/2001 | Colantuono ........... H01R 24/64 439/676 |
| 6,456,495 B1 | 9/2002 | Wieloch et al. |
| 6,536,029 B1 | 3/2003 | Boggs et al. |
| 6,829,666 B1 * | 12/2004 | Deneroff et al. ............. 710/305 |
| 6,935,868 B1 * | 8/2005 | Campini et al. ................ 439/67 |
| 7,040,913 B2 * | 5/2006 | Parsadayan ................... 439/374 |
| 7,236,363 B2 * | 6/2007 | Belady .......................... 361/699 |

(Continued)

FOREIGN PATENT DOCUMENTS

EP    2615896 A2 *    7/2013

OTHER PUBLICATIONS

Singapore Written Opinion & Search Report Jul. 7, 2014 for SG Application No. 2012002879.

*Primary Examiner* — Crystal J Barnes-Bullock
(74) *Attorney, Agent, or Firm* — Fletcher Yoder, PC (57) ABSTRACT

System and method related to a control system including an automation controller with a module bay configured to facilitate coupling with scalable modules. The module bay of the automation controller includes a plurality of bay connectors configured to communicatively couple with the scalable module connectors. The module bay may include an open end to facilitate extension beyond an edge of the open end by a module or a closed end.

22 Claims, 7 Drawing Sheets

(56) References Cited

U.S. PATENT DOCUMENTS

| | | | |
|---|---|---|---|
| 7,457,687 B1 * | 11/2008 | Porter | A01G 25/165 137/624.11 |
| 7,800,894 B2 * | 9/2010 | Davis | 361/679.33 |
| 7,821,790 B2 * | 10/2010 | Sharma et al. | 361/727 |
| 8,265,797 B2 * | 9/2012 | Nickerson et al. | 700/284 |
| 8,411,440 B2 * | 4/2013 | Dunwoody et al. | 361/699 |
| 8,441,793 B2 * | 5/2013 | Dunwoody et al. | 361/699 |
| 8,745,423 B2 * | 6/2014 | Sultenfuss | 713/300 |
| 2002/0021558 A1 | 2/2002 | Schwarz et al. | |
| 2009/0279953 A1 * | 11/2009 | Allard | E03F 1/005 405/39 |
| 2011/0131455 A1 | 6/2011 | Law et al. | |

* cited by examiner

SYSTEM AND METHOD FOR COUPLING AN AUTOMATION CONTROLLER AND SCALEABLE MODULE

BACKGROUND

The present disclosure relates generally to industrial automation and control systems, such as those used in industrial and commercial settings. More particularly, embodiments of the present disclosure relate to techniques for providing and communicatively interlocking modules (e.g., programmable control modules) with automation controllers of such systems.

In operation, industrial automation and control systems control and monitor the function of industrial automation components, such as factory automation devices and the like. Industrial automation systems include various components, such as automation controllers (e.g., programmable logic controllers), semiconductor power electronic circuits, power supplies, motor starters, relays, and so forth, that are utilized to monitor and control a process or system. Typically, during operation, an automation controller examines a series of inputs reflecting the status of a controlled process and changes outputs affecting control of the controlled process. For example, an automation controller typically receives input signals from sensors distributed throughout a process and provides output signals to actuators and devices throughout the process. The automation controller often controls the process by performing logic based on the input signals and providing the output signals based on the results of processing the input signals. The output signals from the automation controller may modify the process to accommodate a desired result in view of the inputs.

In traditional automation and control systems, various components or modules of the system interconnect. Certain components cooperate with other components to expand functionality. For example, industrial automation controllers may provide for connection of additional input/output (I/O) modules to add input and output functionality to such controllers. Indeed, adding an I/O module and associated terminal blocks may allow a particular controller to interface with a specific type of control equipment. It is now recognized that traditional systems typically include coupling configurations between automation controllers and related modules that constrain certain functionalities and arrangements. Accordingly, it is now recognized that it is desirable to develop an interlocking system for securing modules that provides flexibility with regard to configuration and functionality while facilitating assembly.

BRIEF DESCRIPTION

In one embodiment of the present disclosure, a control system includes an automation controller, such as a PLC, with a module bay configured to facilitate coupling with scaleable modules. The module bay of the automation controller includes a plurality of bay connectors configured to communicatively couple with the scaleable module connectors. Further, the plurality of bay connectors may be arranged with respect to one another such that a first quantity of standard-sized modules or a second quantity of larger than standard-sized modules can be communicatively coupled with the automation controller and disposed within the module bay, wherein the second quantity is less than the first quantity. Additionally, the module bay may include an open end such that a portion of a larger than standard-sized module coupled with one or more of the plurality of bay connectors can extend outside of the bay module through and beyond an edge of the open end.

In another embodiment of the present disclosure, a control system includes an automation controller and one or more scalable modules. The automation controller includes a module bay with a plurality of bay connectors configured to communicatively couple with module connectors. Correspondingly, the one or more scalable modules are coupleable with the plurality of bay connectors. The plurality of bay connectors may be arranged with respect to one another such that a first quantity of standard-sized modules or a second quantity of larger than standard-sized modules can be communicatively coupled with the automation controller and disposed within the module bay, wherein the second quantity is less than the first quantity. Further, the module bay may include an open end such that a portion of a larger than standard-sized module coupled with one or more of the plurality of bay connectors can extend outside of the bay module through and beyond an edge of the open end.

In yet another embodiment of the present disclosure, a method of manufacturing a control system is provided. The method includes manufacturing an automation controller and manufacturing one or more scalable modules. The automation controller may be manufactured to include a module bay, wherein the module bay includes a plurality of bay connectors configured to communicatively couple with module connectors. The one or more scalable modules may be manufactured such that they are coupleable with the plurality of bay connectors.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

While the present disclosure may be susceptible to various modifications and alternative forms, specific embodiments have been shown by way of example in the drawings and tables and have been described in detail herein. However, it should be understood that the embodiments are not intended to be limited to the particular forms disclosed. Rather, the disclosure is to cover all modifications, equivalents, and alternatives falling within the spirit and scope of the disclosure as defined by the following appended claims. Further, although individual embodiments are discussed herein to simplify explanation, the disclosure is intended to cover all combinations of these embodiments.

Embodiments of the present technique are generally directed to industrial control and automation systems formed from automation controllers and modules, wherein the control and automation systems facilitate configuration or modification of system functionality by facilitating coupling or decoupling of different types of modules with the associated automation controllers. Disclosed embodiments provide an interlocking system for connecting modules with an automation controller that accommodates scalable modules to achieve various different system functions and configurations. Scalable modules include modules that have been designed and manufactured with differing geometries to accommodate components associated with particular functionalities. For example, a scalable module may include a module that has been scaled to as certain size to provide additional space for cooling or electronic components. Thus, present embodiments include automation controllers that are capable of coupling with various scalable modules of different geometries.

Specifically, the present techniques provide attachment features that facilitate configurable engagement of modules of varying sizes, types, and functionalities with associated automation controllers. In particular, present embodiments include scalable (e.g., scalable-width, scalable-height) control modules that vary in size according to certain desired functionalities, and an automation controller with a module bay configured to couple with the various scalable modules. Indeed, the present techniques include facilitating engagement of modules of various different sizes and types to the same automation controller such that the modules can be assembled in different arrangements to provide varying functionalities of the resulting automation system. Specifically, present embodiments include communicative coupling features on an automation controller and on corresponding scalable modules that accommodate configuration of a control system with modules that are all of a uniform size or of varying sizes. This facilitates interaction between a single automation controller and a wide variety of different types of modules (e.g., programmable modules, control modules, input/output modules, display modules, actuator modules). Likewise, this facilitates modification of controllers to achieve a wider variety of purposes.

Figure 1:
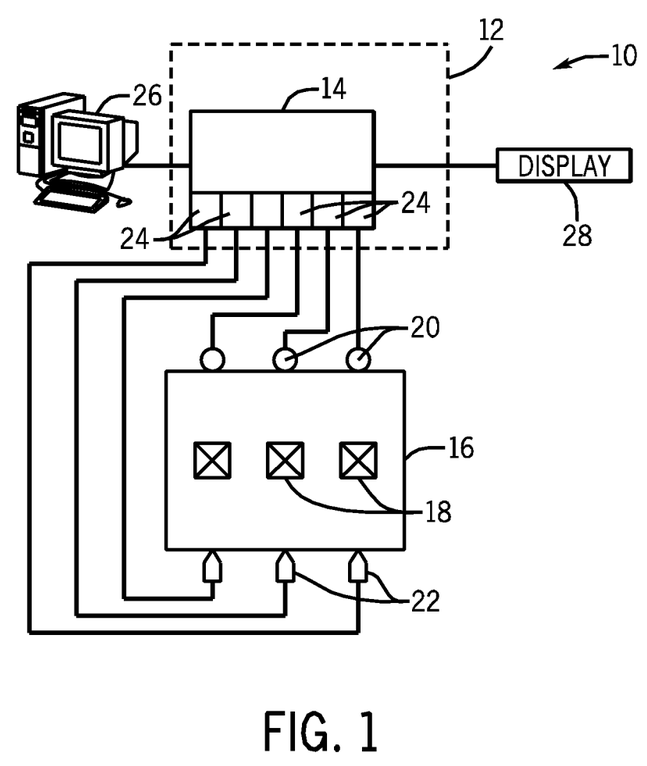
FIG. 1 illustrates a block diagram of an industrial automation and control system in accordance with an embodiment of the present technique.

Turning now to the drawings and referring first to FIG. 1, an exemplary industrial automation and control system 10 is illustrated. The system 10 includes an enclosure 12, such as an electrical cabinet, in which electrical components, such as monitoring and/or control components, are housed. Examples of such components may include relays, motor starters, and programmable logic controllers (PLCs), among others. The enclosure 12 may be suitable, for example, for assembly of a motor control center or use with industrial, commercial, marine, or other electrical systems. The enclosure 12 may be made of any suitable material, such as heavy gage sheet metal, reinforced plastics, and so forth. In certain embodiments, the enclosure 12 includes individual compartments or other structures that support the electrical components.

In the illustrated embodiment, the system 10 includes an automation controller 14 capable of assembly and configuration with scaleable modules in accordance with present techniques. The automation controller 14, which may include a PLC, is adapted to interface with components of a machine, system, or process 16. It should be noted that such an interface in accordance with embodiments of the present techniques may be facilitated by the use of certain network strategies. Indeed, an industry standard network may be employed, such as DeviceNet, to enable data transfer. Such networks permit the exchange of data in accordance with a predefined protocol, and may provide power for operation of networked elements.

The process 16 may take many forms and include devices for accomplishing many different and varied purposes. For example, the process 16 may comprise a compressor station, an oil refinery, a batch operation for making food items, a mechanized assembly line, and so forth. Accordingly, the process 16 may comprise a variety of operational components 18, such as electric motors, valves, actuators, temperature elements, pressure sensors, or a myriad of manufacturing, processing, material handling, and other applications. Further, the process 16 may comprise control and monitoring equipment for regulating process variables through automation and/or observation. For example, the illustrated process 16 comprises sensors 20 and actuators 22 that interface with the automation controller 14. The sensors 20 may comprise any number of devices adapted to provide information regarding process conditions. For example, the sensors 20 may include temperature sensors, pressure sensors, motion detectors, and the like. In operation, the sensors 20 may detect process conditions and provide signals to the automation controller 14 indicative of the detected conditions. The actuators 22 may include any number of devices adapted to perform a mechanical action in response to a signal from the automation controller 14.

As illustrated, the sensors 20 and actuators 22 are in communication with the automation controller 14 (e.g., a PLC). In one embodiment, the sensors 20 and actuators 22 may communicate with the automation controller 14 via one or more scalable modules 24 (e.g., scalable I/O modules) communicatively coupled to the automation controller 14. Indeed, the scalable modules 24 may be configured to transfer input and output signals between the automation controller 14 and features associated with the controlled process 16. Because the automation and control system 10 is capable of utilizing the scalable modules 24 with the automation controller 14, certain I/O modules may include more inputs and outputs than other modules because they are sized to accommodate the added functionality. Further, some modules may include integral I/O terminals or connections. Also, as discussed below, some of the scalable modules 24 may include a completely different functionality.

In accordance with present embodiments, the scalable modules 24 may also include programmable control modules configured to provide control functionality. For example, a one of the scalable modules 24 may be programmed with logic that coordinates with the automation controller 14 to perform certain operations. In yet another embodiment, the scalable modules 24 may include display features, mechanically actuated input features, and the like. Indeed, a variety of different types of the scalable modules 24 may be employed in the automation and control system 10 via attachment with the automation controller 14 because present embodiments are configured to coordinate with, couple with, and include the different types of scalable modules 24. These scalable modules 24 along with coupling and communication features of the automation controller 14 enable accommodation of features that are desirable or required for varied functionality. The control system 10 may be configured to have a broad and varied range of functionality because the automation controller 14 is capable of coupling with the scalable modules 24. For example, the scalable modules 24 enable inclusion of different sized printed circuit boards (PCBs), cooling features, and operational features (e.g., display screens, buttons, switches) that are required or desirable for control functions and the like.

In certain embodiments, the sensors 20 and actuators 22 may be utilized to operate process equipment. Indeed, the sensors 20 and actuators 22 may be utilized within process loops that are monitored and controlled by the automation controller 14 and/or one or more of the scalable modules 24 to control aspects of the process 16. Such process loops may be activated based on process inputs (e.g., input from a sensor 20) or direct operator input received through a user interface device 26. In one embodiment, the automation controller 14 may receive electrical signals from the sensors 20 via the scalable modules 24, perform a logic function based on the electrical signals, and generate at least one signal that is transmitted to the actuators 22 via the scalable modules 24 based on the logic function. Thus, the automation controller 14 may control aspects and characteristics of the process 16 by controlling the actuators 22 based on process data obtained via the sensors 20. As a specific example, a one of the sensors 20 may detect a pressure level and transmit a value for the detected pressure level to the automation controller 14 for analysis via one of the scalable modules 24 (or via built-in I/O features). The value for the detected pressure level may be analyzed and determined to be excessive by logic within the automation controller 14 (or a programmed scalable module), which may then instruct a one of the actuators 22 to close via an electrical signal transmitted through one of the scalable modules 24 to reduce the pressure within the process.

It should be noted that I/O modules are one type of the scalable modules 24 that may be employed with the automation controller 14 in accordance with present embodiments. The I/O modules include input modules that receive signals from input devices, such as photo-sensors and proximity switches, output modules that use output signals to energize relays or to start motors, and bidirectional I/O modules, such as motion control modules, which can direct motion devices and receive position or speed feedback. In some embodiments, the I/O modules may convert between AC and DC analog signals used by devices on a controlled machine or process and +5-volt DC logic signals used by the automation controller 14. Additionally, some of the I/O modules may provide digital signals to digital I/O devices and receive digital signals from digital I/O devices. Further, in some embodiments, the I/O modules that are used to control motion devices or process control devices may include local microcomputing capability on the I/O module.

In some embodiments, certain I/O features (e.g., I/O terminals and modules) are integral with the automation controller 14, and a module bay of the automation controller 14 provides the ability to supplement the integral I/O functionality of the automation and control system 10. For example, the scalable modules 24 may include I/O modules that can be added or removed via expansion slots or other suitable mechanisms of a module bay of the automation controller 14. Thus, when input or output components are added to the process 16 such that an initial capacity of the automation controller 14 is exceeded, the automation and control system 10 can be supplemented to accommodate the new components of the process 16 by coupling additional I/O modules to the automation controller 14. Specifically, for example, new sensors 20 or actuators 22 may be added to control the process 16 and additional I/O modules may be installed in a module bay of the automation controller 14 to accommodate and support the new sensors 20 and actuators 22. These I/O modules of the scalable modules 24 serve as an electrical interface to the automation controller 14.

Similarly, if additional functionality related to certain control features or accessibility to control or monitoring of the automation and control system 10 is desired, different types of the scalable modules 24 may be added via the module bay. For example, if a particular type of control loop is added to the process 16 and the newly added control loop requires certain control logic, it may be useful to simply add a programmable control module that is programmed or configured to perform the desired operations associated with any added inputs and outputs. Specifically, for example, a control loop for a material drying operation may be added to the process 16, wherein the operation includes a temperature sensor and a heat pump that should be controlled based on a measurement provided via the temperature sensor. To address this added procedure, a control module with logic for controlling the material drying operation (e.g., by receiving input from the temperature sensor, performing logic such as a threshold comparison, and providing output to the heat pump) may be coupled to the automation controller 14 as one of the scalable modules 24. As another example, if the ability to access visual data from the automation controller 14 or scalable modules 24 is desired, a display module may be coupled to the automation controller 14 via the module bay. As yet another example, if certain types of interaction with or accessibility to the automation controller 14 are desired, a module including an activation mechanism (e.g., a button, switch, or touch-screen) may be added as one of the scalable modules 24. It should be noted that each of these scalable modules 24 may have a different size to accommodate features associated with functionality, and the automation controller 14 facilitates coupling with the differently sized scalable modules 24.

In the illustrated embodiment, the automation and control system 10 also includes a display 28, such as an LCD or other display, configured to display output parameters, such as operating parameters of the process 16, temperatures or pressures sensed by the sensors 20, positional information of the actuators 22, and so forth. In some embodiments, the display 28 may be incorporated into one or more of the scalable modules 24 communicatively coupled with the module bay of the automation controller 14.

Figure 2:
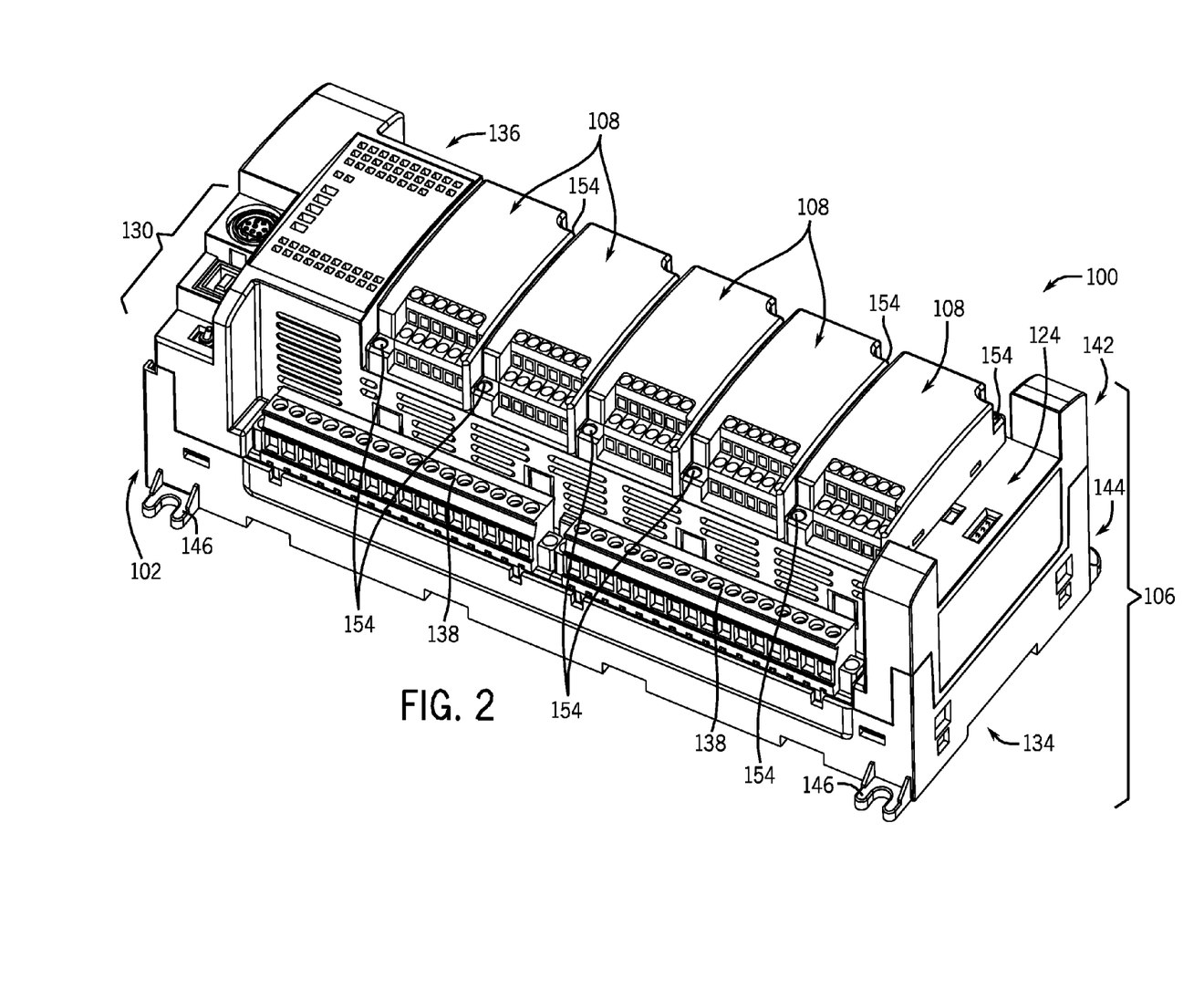
FIG. 2 illustrates a perspective view of an automation controller and attached standard-sized modules in accordance with an embodiment of the present technique.
Figure 3:
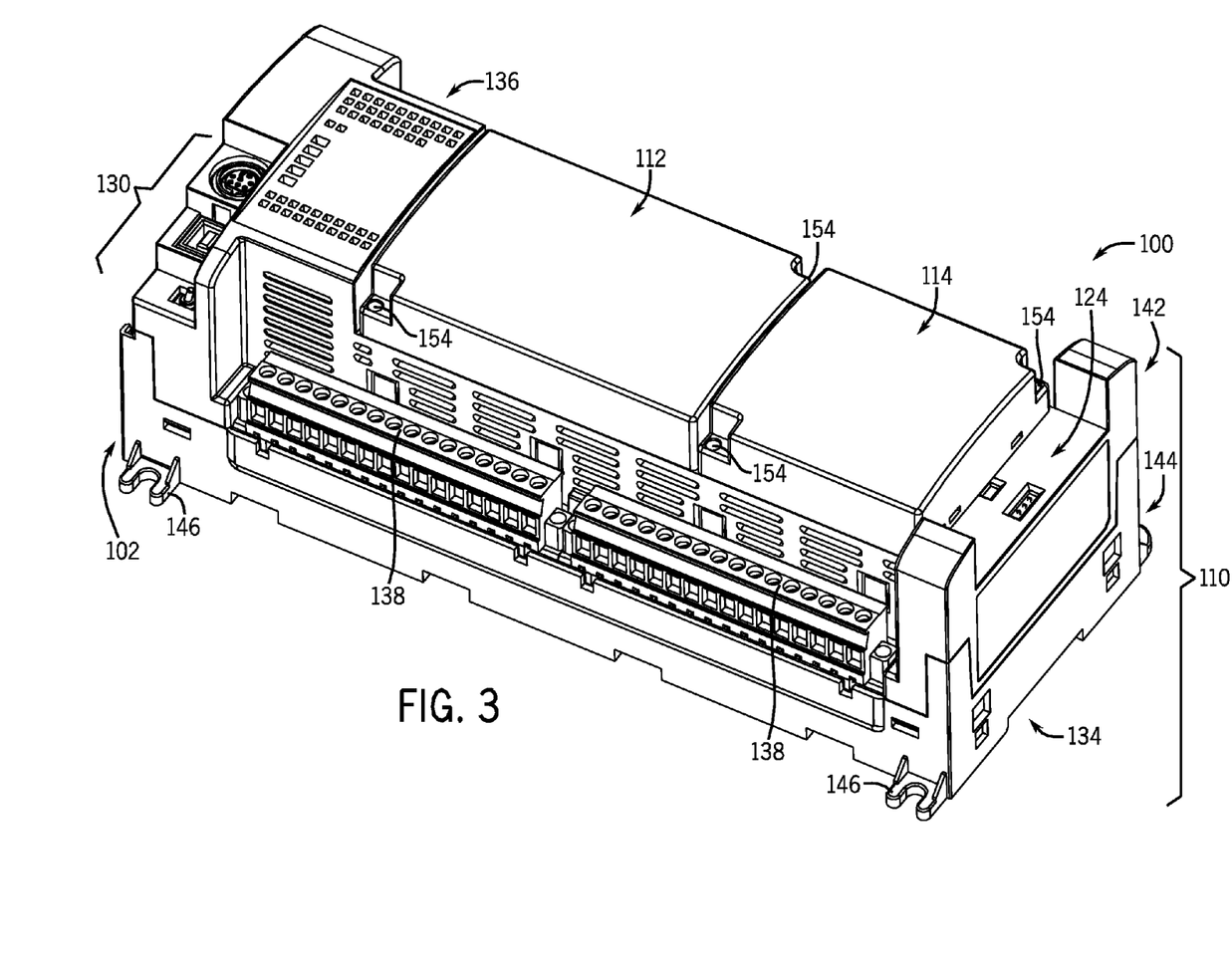
FIG. 3 illustrates a perspective view of the automation controller and attached greater than standard-sized modules in accordance with an embodiment of the present technique.
Figure 4:
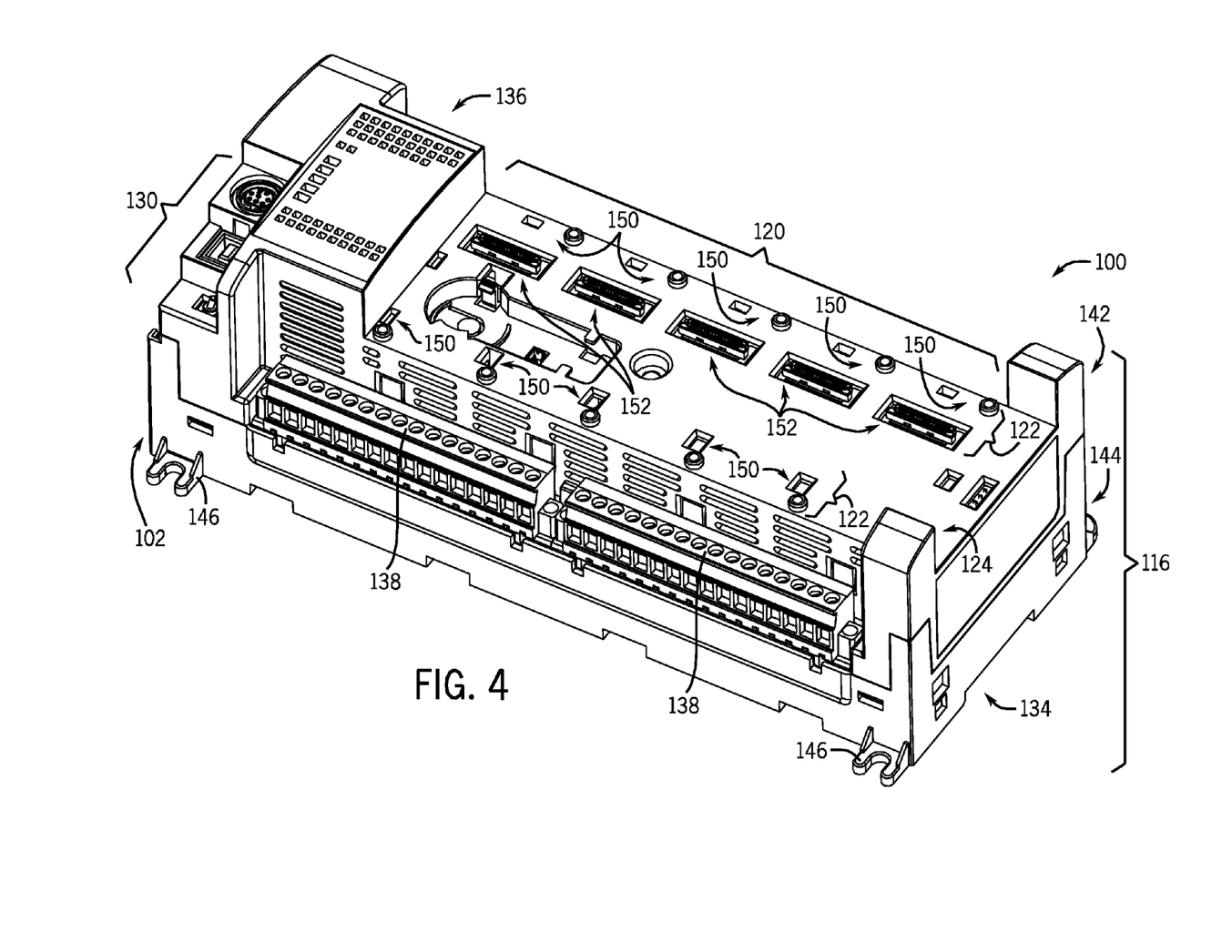
FIG. 4 illustrates a perspective view of the automation controller without any modules attached in accordance with an embodiment of the present technique.

Turning now to FIGS. 2-4, an exemplary industrial automation and control system 100 in accordance with present embodiments is illustrated in three different configurations with three corresponding perspective views of the automation and control system 100. Each of the configurations includes an automation controller 102, such as a PLC, coupled with or configured to couple with scalable modules. In the illustrated embodiments, the scalable modules include modules of uniform height and scalable-width. However, in other embodiments, different geometric aspects of the modules may be scalable. Turning to the illustrated configurations, in a first configuration 106, the system 100 is illustrated with a plurality of standard-width modules 108 coupled with the automation controller 102. In a second configuration 110, the system 100 is illustrated with a triple-standard-width module 112 and a double-standard-width module 114 coupled with the automation controller 102. In a third configuration 116, the system 100 is illustrated without any modules such that a module bay 120 configured to couple with the various scalable-width modules is exposed, including bay connectors 122 and an open end 124 that are arranged to accommodate the various sizes and types of scalable modules.

The automation controller 102 includes a variety of components and features that facilitate assembly, configuration, and operation of the automation controller 102. For example, in the illustrated embodiment, the automation controller 102 include slots, vents, plugs, connectors, and other interface structures. Such structures may facilitate operation of the automation controller 102, interfacing with the automation controller 102, coupling between assembly components of the automation controller 102, coupling of the automation controller 102 with other features (e.g., a DIN rail), and/or operation of the automation controller 102. Specifically, in the illustrated embodiment, the automation controller 102 includes various communication ports 130 that may be utilized to access, communicate with, and configure the automation controller 102. Further, the illustrated embodiment includes a communicative coupling feature disposed within a groove 134 for attachment to a bus bar or DIN rail. Certain features of the automation controller 102 may be coupled (e.g., via plug-in connections) to a backplane that provides for distribution of power and data signals. Such backplanes are currently in use throughout industrial applications to provide data and control signals to and from automation controllers, computer components and peripherals, and so forth. The automation controller 102 also includes various indicators (e.g., light emitting diodes) 136 that provide status indications for the automation controller 102 and or certain modules coupled with the automation controller 102. Further, in the illustrated embodiment, the automation controller 102 includes integral terminal blocks 138. These terminal blocks 138 may be utilized to provide input signals to and output signals from the automation controller 102 and/or attached scalable modules.

In one embodiment, the automation controller 102 includes a cover 142 and a base 144. The cover 142 and base 144 couple together and coordinate to enclose internal components of the automation controller 102 to protect the internal components from inadvertent operation, tampering, manipulation, exposure to dust and/or debris, and so forth. The cover 142 and the base 144 may also include certain other functional aspects. For example, the cover 142 may be configured to enable other components to be connected or attached to the automation controller 102 as described in detail below. Similarly, the base 144 may be configured to facilitate installation of the automation controller 102 in the enclosure 12 or the like. Indeed, the automation controller 102 includes features, such as the groove 134 and tabs 146 that are configured to facilitate attachment of the automation controller 102 to a support (e.g., a bus disposed along a wall of an electrical cabinet) or a wall. In certain embodiments, the automation controller 102 may be secured to an electrical cabinet using fasteners that pass through the tabs 146 into a back panel of the electrical cabinet or the groove 134 may be slidably engaged with a rail.

The automation controller 102 includes coupling features that facilitate attachment with the scalable modules (e.g., modules 108, 112, 114), in a fashion that facilitates configuration of aspects of the automation controller 102. Indeed, different types of scalable modules with different types of functionality may be coupled to the automation controller 102 via the bay connectors 122. For example, the bay connectors 122 may accommodate standard-width modules 108, double-standard-width modules 114, triple-standard-width modules 112, and so forth. Specifically, as clearly illustrated by the representation of the third configuration 116, the bay connectors 122 of the module bay 120 include interface slots and/or receptacles 150, and communication ports 152 configured to receive one or more corresponding coupling features or communication features of the scalable modules. Specifically, for example, the illustrated scalable modules include receptacles and screws 154 that are configured to engage with receptacles 150 of the module bay 120. Thus, the scalable modules and the automation controller 102 can be coupled together. It should be noted, in other embodiments, the bay connectors 122 may include extension features that couple with receptacles of the scalable modules or some combination of receptacles and extensions.

As illustrated by the representations of the first configuration 106 and the second configuration 110 in FIGS. 2 and 3, a variety of scalable modules may be coupled to the automation controller 102 for performing control/monitoring functions of a specified process or system. For example, FIG. 2 illustrates the standard-width scalable modules 108, which include built-in I/O terminals, coupled with the automation controller 102, while FIG. 3 illustrates the scalable modules 112, 114 with different widths coupled to the automation controller 102. Indeed, the module bay 120 and the corresponding bay connectors 122 of the automation controller 102 facilitate interaction with different types of scalable controllers. Specifically, the module bay 120 is substantially planar, which allows for overlapping of scalable modules between connectors. This provides access to extra space for a particular module and extra accessibility to power and communication from the automation controller 102. Thus, when a single module (e.g., the double-standard-width module 114) has a width scaled to accommodate a particular functionality, it can be accommodated within the module bay 120. Specifically, for example, a particular module may require additional space for cooling elements, access to air, internal components, or the like. Indeed, a particular module may require two or more communicative couplings with the automation controller via the communication ports 152 and corresponding communication connectors of the module. This can be achieved in accordance with present embodiments because the module bay 120 provides access to the space and coupling features associated with a standard-width module (e.g., standard-width module 108).

Figure 5:
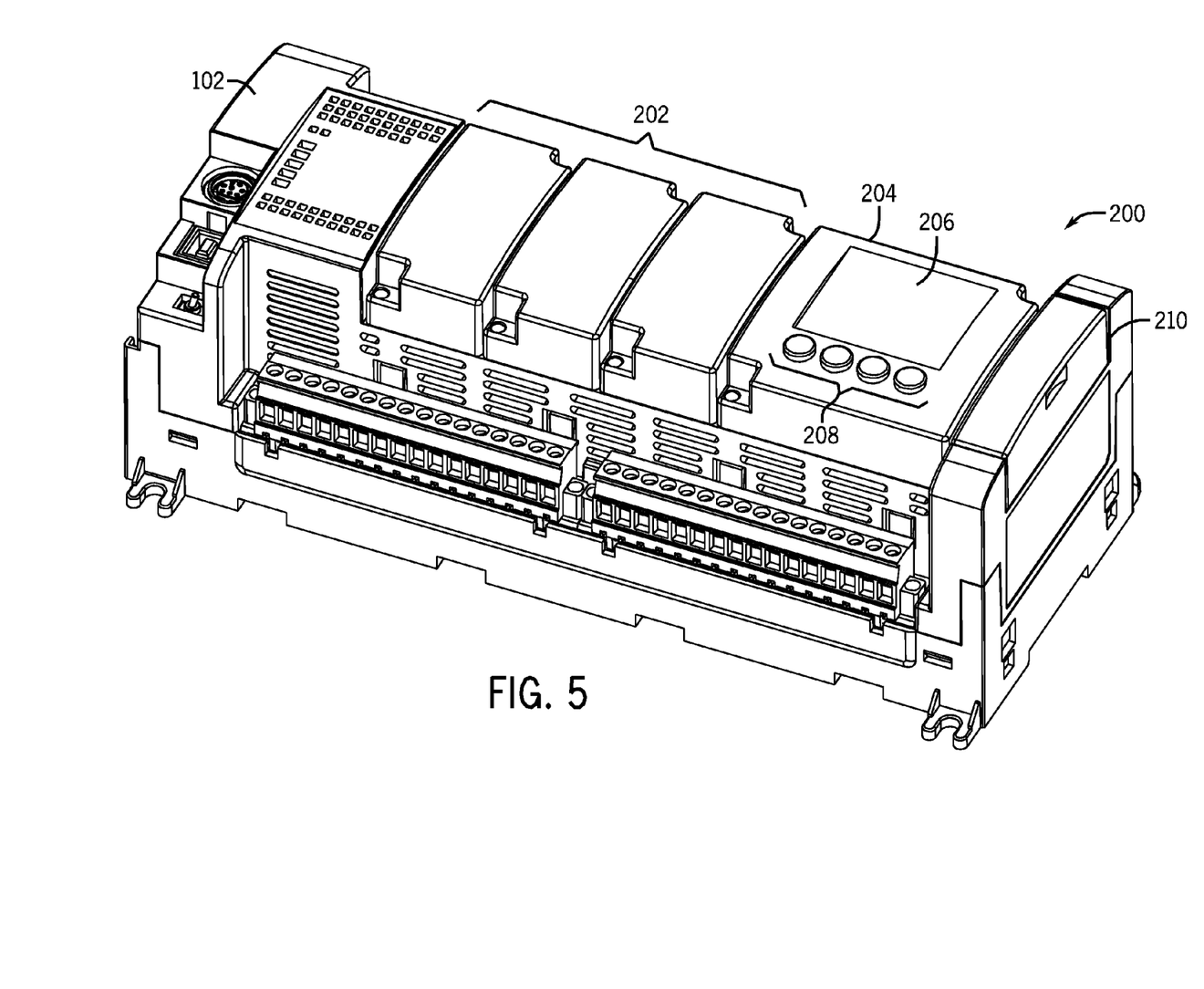
FIG. 5 illustrates a perspective view of the automation controller with a plurality of modules attached, including a display module in accordance with the present technique.

FIG. 5 is a perspective view of a control system 200 including the automation controller 102, a set of standard-width modules 202, and a display module 204 in accordance with present embodiments. The set of standard-width modules 202 includes three standard-width modules. The display module 204 spans a width of the module bay 120 corresponding to two standard-width modules. While the display module 204 may only couple with a single communication port 152 of the automation controller 102, the added width (relative to a standard-width) of the display module 204 may be desirable to facilitate efficient display functionality. Indeed, the display module 204 may include a liquid crystal display (LCD) 206 or another type of display component that is preferably of a certain size to accommodate interfacing with a user. Further, in the illustrated embodiment, the display module 204 includes a plurality of activation features 208. Specifically, the illustrated activation features 208 include physical buttons that are configured to be pressed to control certain aspects of the display module 204 or the automation controller 102. For example, the activation features 208 may be activated to initiate performance of certain functions by the automation controller 102 or attached modules. The activation features 208 may also be activated to make adjustments to display characteristics (e.g., contrast, brightness, or type of data being displayed) of the display module 204. In some embodiments, a scalable module may be attached that merely includes activations features for interacting with the control system 200.

It should be noted that, in the embodiment illustrated by FIG. 5, the system 200 includes an attachment, which may be referred to as a blank 210, coupled to the open end 124 of the module bay 120. The blank 210 may simply function to take up space in the module bay 120 of the automation controller 102 or to block access to certain features of the control system 200 (e.g., features of the automation controller 102 or attached modules). As will be discussed below, in other embodiments, the blank 210 may be removed to facilitate extension of one or more modules attached to the automation controller 102 into and/or beyond an edge of the open end 124 of the module bay 120. Indeed, by providing the open end 124 of the module bay 120, present embodiments may accommodate extra scalable modules.

Figure 6:
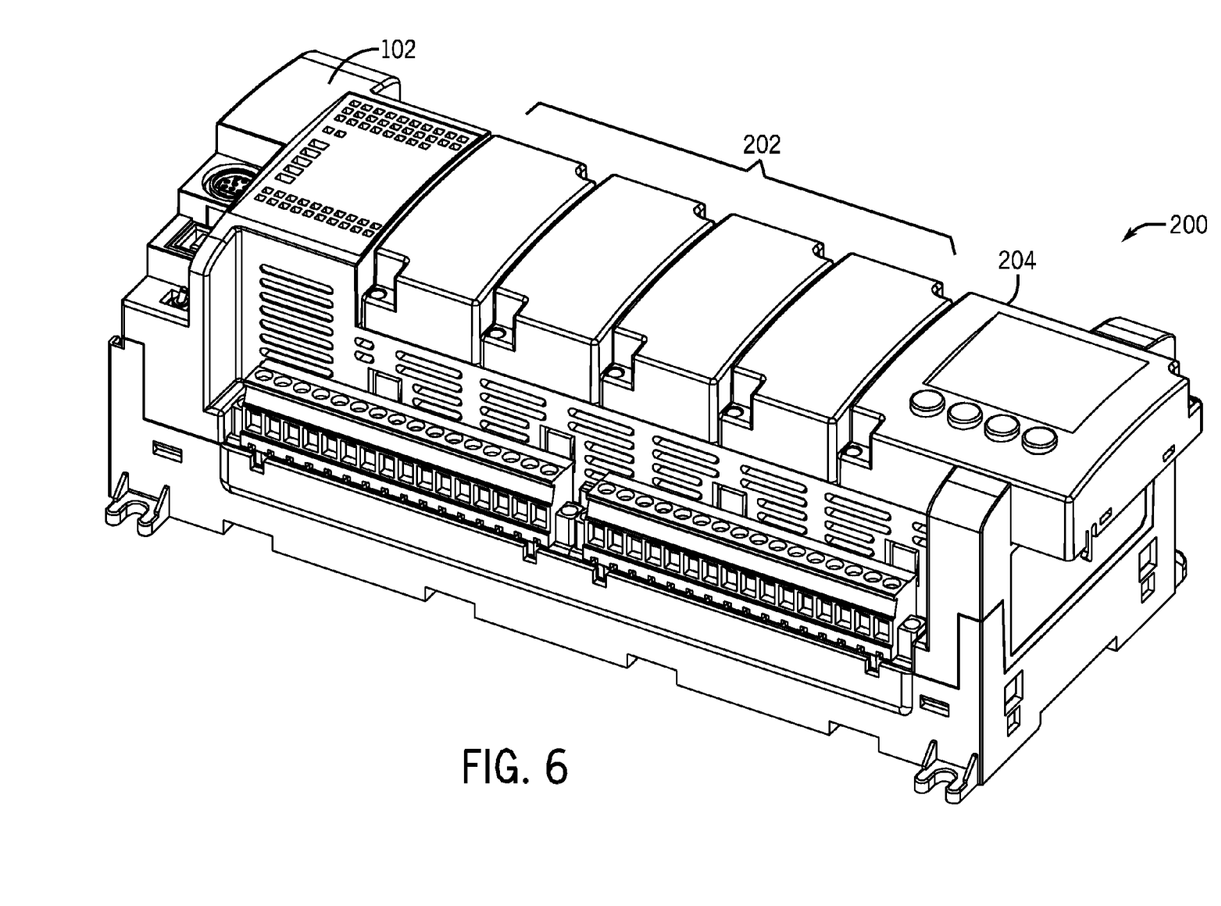
FIG. 6 illustrates a perspective view of the automation controller with a plurality of modules attached and a module extending beyond an edge of an open end of a module bay of the automation controller in accordance with the present technique.

FIG. 6 is a perspective view of the control system 200 including the automation controller 102, the set of standard-width modules 202, and the display module 204 in accordance with present embodiments. As in the embodiment illustrated in FIG. 5, the display module 204 spans a width corresponding to two standard-width modules. However, the set of standard-width modules 202 includes an additional standard-width module relative to the embodiment illustrated in FIG. 5. The inclusion of an additional standard-width module in the set of standard-width modules 202 is enabled by removal of the blank 210. Indeed, with the blank 210 removed, the display module 204 is able to remain communicatively coupled to the automation controller 102 while a portion of the display module 204 extends through and beyond an edge of the open end 124 of the module bay 120. Thus, the display module 204 is essentially cantilevered from the automation controller 102 in the embodiment illustrated by FIG. 6. As is demonstrated by the difference between the exemplary embodiments illustrated in FIGS. 5 and 6, by providing the open end 124 of the module bay 120, present embodiments may accommodate additional scalable modules and/or larger scalable modules. In other embodiments, different types of modules may extend into or past the open end 124. For example, in some embodiments, modules including a portion without communicative coupling features could extend past the open end 124 by one or more standard-widths or some other distance. It should be noted that in some embodiments, different or additional geometric characteristics (e.g., height) of the modules may be scalable and accommodated by a module bay of the automation controller. Further, in some embodiments, a plurality of modules may extend into or beyond an open end of the module bay 120.

Figure 7:
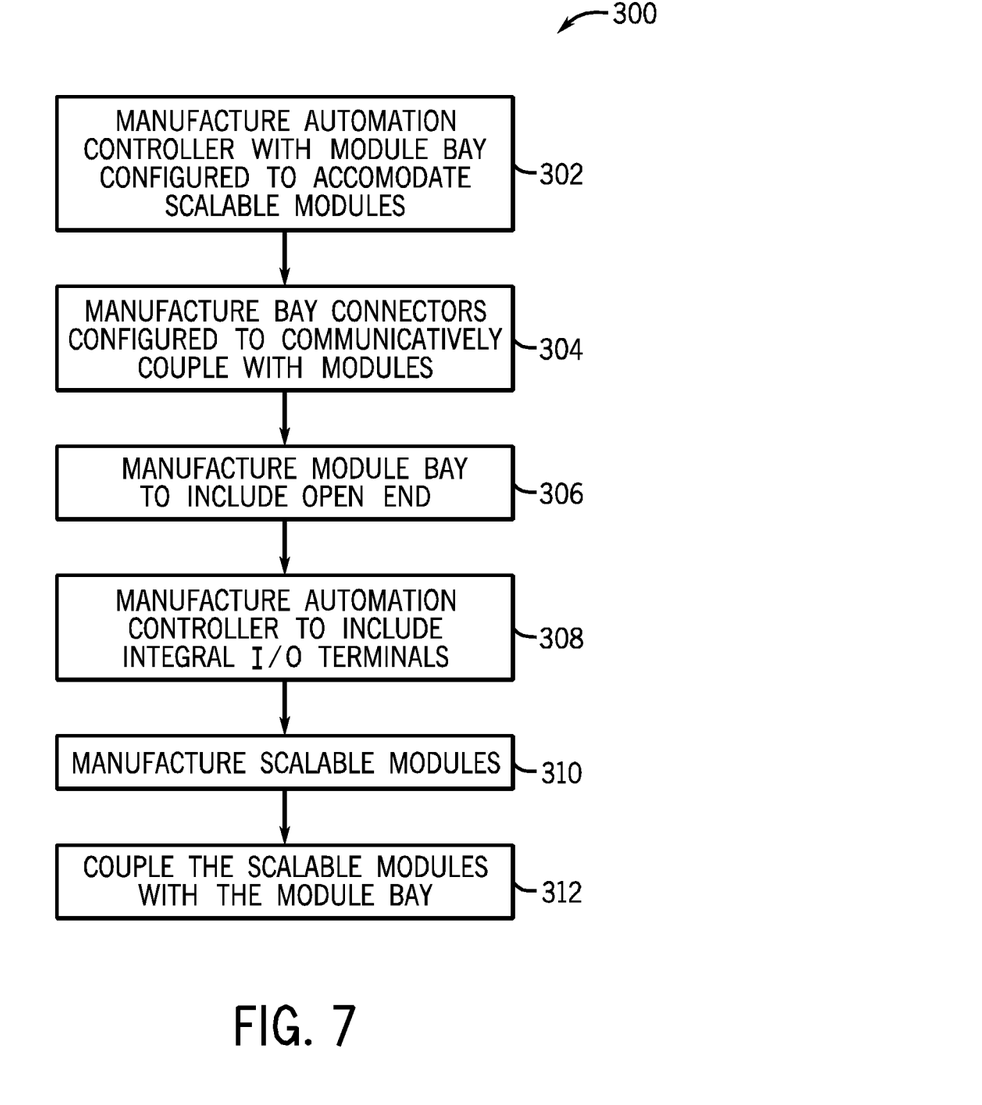
FIG. 7 illustrates a process flow diagram for a method of manufacturing an automation controller and scalable modules in accordance with the present technique.

FIG. 7 illustrates a process flow diagram for a method or process of manufacturing a control system in accordance with present embodiments. The process is generally indicated by reference numeral 300 and includes blocks that are representative of steps or acts performed as components of the process. As illustrated by block 302, the method includes manufacturing an automation controller such that the automation controller includes a module bay. Block 302 may include manufacturing a top cover of the automation controller that is molded or otherwise formed to include features for receiving and/or coupling with scalable modules in accordance with present embodiments. As represented by block 304, the module bay of the automation controller may be manufactured to include a plurality of bay connectors configured to communicatively couple with module connectors. Further, as represented by block 306, the module bay may be manufactured to include an open end configured to enable one or more scalable modules to couple with one or more bay connectors and extend past an edge of the open end. In some embodiments, as represented by block 308, the automation controller may be manufactured to include integral I/O terminals that are configured to provide input to and output from the automation controller or associate modules.

As illustrated by block 310, the process also includes manufacturing one or more scalable modules that are configured to be coupled with the plurality of bay connectors. Different types and sizes of the scalable modules may be manufactured based on desired functionality. These may include modules that include dimensions beyond that of a standard-sized module or with varying functionalities. For example, in one embodiment, a scalable-width or scalable-height display module may be manufactured to include an LCD display or the like that is configured to display data provided via the automation controller. As another example, manufacturing the scalable modules may include assembling extended housings of the modules to incorporate various sizes of printed circuit boards or cooling systems. In yet another example, manufacturing the scalable modules may include assembling an I/O module that is sized to provide more I/O than a standard-sized module and to include associated I/O terminals. Finally, as illustrated by block 312, the process may include attaching one or more of the scalable modules with the automation controller. This may include attaching a scalable module such that it spans an area of the module bay of the automation controller greater than would be spanned by a standard-sized module. Similarly, this may include attaching a scalable module such that it extends into and/or past the open end of the module bay.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A control system, comprising:
   an automation controller; and
   a module bay of the automation controller comprising a plurality of bay connectors configured to communicatively couple with module connectors, wherein the module bay and the plurality of bay connectors are configured to facilitate communicative coupling with one or more scalable modules, and wherein the bay connectors of the module bay are spaced to accept, interchangeably, multiple scalable modules of a first, smaller dimension, or a single scalable module of a second, larger dimension in the same space in the module bay, and wherein the module bay comprises receptacles for receiving fasteners for securing the scalable modules over one or more of the bay connector, and wherein the bay connectors, in operation, carry signals between the automation controller and the scalable modules mounted on the module bay of the automation controller for operation of the control system.

2. The control system of claim 1, wherein the plurality of bay connectors are arranged with respect to one another such that a first quantity of standard-sized modules or a second quantity of larger than standard-sized modules can be communicatively coupled with the automation controller and disposed within the module bay, wherein the second quantity is less than the first quantity.

3. The control system of claim 2, wherein the plurality of bay connectors are arranged with respect to one another such that five standard-sized modules can be communicatively coupled with the automation controller and disposed within the module bay or such that a triple-standard-sized module and a double-standard-sized module can be communicatively coupled with the automation controller and disposed within the module bay.

4. The control system of claim 2, wherein the module bay comprises an open end such that a portion of a larger than standard-sized module coupled with one or more of the plurality of bay connectors can extend outside of the module bay through and beyond an edge of the open end.

5. The control system of claim 1, wherein the module bay comprises an open end configured to facilitate coupling with an extended control module such that a portion of the extended control module extends into the open end and beyond an edge of the open end of the module bay.

6. The control system of claim 1, wherein the automation controller comprises a plurality of integral input/output terminals configured to communicate with the one or more scalable modules via the bay connectors when the one or more scalable modules are coupled with the bay connectors.

7. The control system of claim 1, wherein the automation controller comprises a plurality of status indicators and at least one communication link connector.

8. The control system of claim 1, wherein the one or more scalable modules comprises scalable-width or scalable-height modules.

9. A control system, comprising:
an automation controller;
a module bay of the automation controller comprising a plurality of bay connectors configured to communicatively couple with module connectors; and
one or more scalable modules coupleable with the plurality of bay connectors;
wherein the bay connectors of the module bay are spaced to accept, interchangeably, multiple scalable modules of a first, smaller dimension, or a single scalable module of a second, larger dimension in the same space in the module bay, and wherein the module bay comprises receptacles for receiving fasteners for securing the scalable modules over one or more of the bay connectors, and wherein the bay connectors, in operation, carry signals between the automation controller and the scalable modules mounted on the module bay of the automation controller for operation of the control system.

10. The control system of claim 9, wherein the one or more scalable modules comprise at least one of a standard-width module, a double-standard-width module, or a triple-standard-width module.

11. The control system of claim 9, wherein the one or more scalable modules comprise at least one module including a display.

12. The control system of claim 11, wherein the module including the display comprises a plurality of mechanically actuated inputs or a touch screen.

13. The control system of claim 9, wherein the module bay comprises an open end configured to enable a one of the scalable modules to couple with one or more bay connectors and extend past an edge of the open end.

14. The control system of claim 9, comprising at least two scalable-width modules of different widths communicatively coupled to the automation controller via the module bay.

15. The control system of claim 9, wherein the automation controller comprises a plurality of integral input/output terminals configured to communicate with the one or more scalable modules via the bay connectors when the one or more scalable modules are coupled with the bay connectors.

16. The control system of claim 9, wherein the one or more scalable modules are sized based on a corresponding printed circuit board size of each scalable module or a geometry desired for cooling each scalable module.

17. A method of manufacturing a control system, comprising:
manufacturing an automation controller including a module bay, wherein the module bay includes a plurality of bay connectors configured to communicatively couple with module connectors; and
manufacturing one or more scalable modules coupleable with the plurality of bay connectors;
wherein the bay connectors of the module bay are spaced to accept, interchangeably, multiple scalable modules of a first, smaller dimension, or a single scalable module of a second, larger dimension in the same space in the module bay, and wherein the module bay comprises receptacles for receiving fasteners for securing the scalable modules over one or more of the bay connectors, and wherein the bay connectors, in operation, carry signals between the automation controller and the scalable modules mounted on the module bay of the automation controller for operation of the control system.

18. The method of claim 17, comprising manufacturing the module bay to include an open end configured to enable a one or more of the scalable modules to couple with one or more bay connectors and extend past an edge of the open end.

19. The method of claim 17, comprising manufacturing a scalable module including a display.

20. The method of claim 17, comprising manufacturing a scalable module that is sized based on a size of a printed circuit board disposed within the scalable module or based on a geometry desired for cooling of the scalable module.

21. The method of claim 17, comprising coupling the one or more scalable modules with the automation controller via the module bay.

22. The method of claim 17, wherein manufacturing the automation controller comprises installing a plurality of input/output terminals configured to communicate with the one or more scalable modules via the bay connectors when the one or more scalable modules are coupled with the bay connectors.

* * * * *